(12) United States Patent
Park et al.

(10) Patent No.: US 10,672,657 B2
(45) Date of Patent: Jun. 2, 2020

(54) SEMICONDUCTOR DEVICE STRUCTURES INCLUDING STAIR STEP STRUCTURES, AND RELATED SEMICONDUCTOR DEVICES

(71) Applicant: Micron Technology, Inc., Boise, ID (US)

(72) Inventors: Matthew Park, Boise, ID (US); Adam L. Olson, Boise, ID (US); Jixin Yu, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 15/906,366

(22) Filed: Feb. 27, 2018

(65) Prior Publication Data

US 2018/0190587 A1    Jul. 5, 2018

Related U.S. Application Data

(62) Division of application No. 14/837,978, filed on Aug. 27, 2015.

(51) Int. Cl.
| | | |
|---|---|---|
| *H01L 21/76* | (2006.01) | |
| *H01L 23/52* | (2006.01) | |
| *H01L 21/768* | (2006.01) | |
| *H01L 21/311* | (2006.01) | |
| *H01L 21/3213* | (2006.01) | |
| *H01L 23/522* | (2006.01) | |

(Continued)

(52) U.S. Cl.
CPC .. *H01L 21/76897* (2013.01); *H01L 21/31111* (2013.01); *H01L 21/31144* (2013.01); *H01L 21/32133* (2013.01); *H01L 21/32139* (2013.01); *H01L 21/7685* (2013.01); *H01L 21/76804* (2013.01); *H01L 21/76829* (2013.01); *H01L 21/76834* (2013.01); *H01L 21/76865* (2013.01); *H01L 23/5226* (2013.01); *H01L 23/53295* (2013.01); *H01L 27/11575* (2013.01); *H01L 27/11582* (2013.01); *H01L 21/76838* (2013.01); *H01L 27/11548* (2013.01)

(58) Field of Classification Search
CPC ......... H01L 21/76897; H01L 21/31111; H01L 21/31144; H01L 21/32133; H01L 21/32139; H01L 21/76804; H01L 21/76829; H01L 21/76834; H01L 21/7685; H01L 21/76865; H01L 23/5226; H01L 23/53295; H01L 27/11575; H01L 27/11582; H01L 21/76838; H01L 27/11548
USPC ................................. 257/773; 438/618, 666
See application file for complete search history.

(56) References Cited

U.S. PATENT DOCUMENTS

| | | |
|---|---|---|
| 8,405,142 B2 | 3/2013 | Katsumata et al. |
| 8,530,350 B2 | 9/2013 | Freeman et al. |

(Continued)

*Primary Examiner* — Didarul A Mazumder
(74) *Attorney, Agent, or Firm* — TraskBritt (57) ABSTRACT

A method of forming a semiconductor device assembly comprises forming tiers comprising conductive structures and insulating structures in a stacked arrangement over a substrate. Portions of the tiers are selectively removed to form a stair step structure comprising a selected number of steps exhibiting different widths corresponding to variances in projected error associated with forming the steps. Contact structures are formed on the steps of the stair step structure. Semiconductor device structures and semiconductor devices are also described.

15 Claims, 6 Drawing Sheets

(51) Int. Cl.
*H01L 23/532* (2006.01)
*H01L 27/11575* (2017.01)
*H01L 27/11582* (2017.01)
*H01L 27/11548* (2017.01)

(56) References Cited

U.S. PATENT DOCUMENTS

| | | |
|---|---|---|
| 8,609,536 B1 | 12/2013 | Ha et al. |
| 8,633,099 B1 | 1/2014 | Shih |
| 8,759,217 B1 | 6/2014 | Chen |
| 8,970,040 B1 | 3/2015 | Chen |
| 2006/0007453 A1 | 1/2006 | Horak et al. |
| 2012/0061744 A1 | 3/2012 | Hwang et al. |
| 2012/0238093 A1 | 9/2012 | Park |
| 2012/0306089 A1 | 12/2012 | Freeman |
| 2013/0043509 A1* | 2/2013 | Cho ............... H01L 27/11526 257/208 |
| 2014/0061747 A1 | 3/2014 | Tanzawa et al. |
| 2014/0067346 A1 | 3/2014 | Biafore et al. |
| 2014/0241026 A1 | 8/2014 | Tanzawa et al. |
| 2014/0264925 A1 | 9/2014 | Chen |
| 2014/0264934 A1 | 9/2014 | Chen |
| 2015/0001613 A1 | 1/2015 | Yip et al. |
| 2015/0011027 A1 | 1/2015 | Lian |
| 2015/0085579 A1 | 3/2015 | Chen |
| 2015/0093897 A1 | 4/2015 | Koh et al. |
| 2017/0062337 A1 | 3/2017 | Park et al. |

\* cited by examiner

SEMICONDUCTOR DEVICE STRUCTURES INCLUDING STAIR STEP STRUCTURES, AND RELATED SEMICONDUCTOR DEVICES

CROSS-REFERENCE TO RELATED APPLICATION

This application is a divisional of U.S. patent application Ser. No. 14/837,978, filed Aug. 27, 2015, pending, the disclosure of which is hereby incorporated herein in its entirety by this reference.

TECHNICAL FIELD

The disclosure, in various embodiments, relates generally to the field of semiconductor device design and fabrication. More specifically, the disclosure relates to methods of forming semiconductor device structures including stair step structures, and to related semiconductor device structures and semiconductor devices.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word line plates, control gate plates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "stair step" structure at edges of the tiers of conductive structures. The stair step structure includes individual "steps" defining contact regions of the conductive structures upon which contact structures can be positioned to provide electrical access to the conductive structures.

As vertical memory array technology has advanced, additional memory density has been provided by forming vertical memory arrays to include additional tiers of conductive structures, and, hence, additional steps in the stair step structures associated therewith. However, increasing the number of steps of a stair step structure without undesirably increasing the overall width (e.g., lateral footprint) of the stair step structure can decrease the margin of error associated with different acts in the process of forming the increased number of steps. A conventional process of forming a stair step structure may include repeated acts of trimming a uniform width of a mask (e.g., photoresist) overlying alternating conductive structures and insulating structures, etching portions of the insulating structures not covered by a remaining portion of the mask, and then etching portions of the conductive structures not covered by remaining portions of the insulating structures. Each of these repeated acts has an associated margin of error permitting the steps of the stair step structure to be suitably sized and positioned to form contact structures thereon. As the number of repeated acts increases, deviation from a desired step width and/or a desired step position may be compounded because errors in the size and/or position of one structure are transferred to subsequently formed structures later in the process. For a large number of steps in the stair step structure, margins of error to achieve suitably sized and positioned steps may be small, such as less than one percent (1%). Achieving such small margins of error can be very difficult using conventional methods, which may result in improperly positioned contact structures and may undesirably decrease yield (e.g., the number of memory cells that are validly programmable and erasable as a percentage of the total number of memory cells in a given batch).

It would, therefore, be desirable to have improved methods of forming stair step structures for semiconductor devices (e.g., vertical memory devices, such as NAND Flash memory devices) that reduce, if not eliminate, the aforementioned problems.

DETAILED DESCRIPTION

Methods of forming semiconductor device structures including stair step structures are described, as are related semiconductor device structures and semiconductor devices (e.g., vertical memory devices, such as 3D NAND flash memory devices). In some embodiments, a method of forming a semiconductor device structure includes forming a photoresist over tiers of alternating conductive structures and insulating structures overlying a substrate. Varied widths of the photoresist and the tiers are selectively removed through a series of material removal processes to form a stair step structure comprising steps exhibiting varied widths relative to one another. The widths of the photoresist and the tiers removed through the material removal processes (and, hence the widths of the steps formed) may be varied in accordance with variations in estimated (e.g., expected, projected) error associated with forming the steps. Such variations in removed width may decrease defects in step size and position that may otherwise decrease yield. After forming the stair step structure, contact structures (e.g., conductive contacts) may be formed over the steps of the stair step structure. The contact structures may be non-uniformly (e.g., unevenly) spaced apart from one another based on the varied widths of the steps. The varied widths of the steps of the stair step structure and the non-uniform spacing to the contact structures may increase contact landing margins such that, even if processing (e.g., material removal) errors do occur, substantially all of the contact structures may nonetheless be provided in suitable contact (e.g., suitable electrical contact) with the conductive structures of the tiers. The methods of the disclosure may decrease error propagation in the formation of semiconductor device structures including stair step structures without increasing the lateral dimensions of the semiconductor device structures (and stair step structures thereof), and may be effectuated without changes to the processing materials and/or the number of processing acts utilized in conventional methods of forming conventional stair step structures. The methods and structures of the disclosure may enhance the manufacturability of semiconductor device structures including stair step structures having relatively large numbers of steps, facilitating the efficient formation of semiconductive devices exhibiting improved performance as compared to conventional semiconductive devices.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the terms "vertical", "longitudinal", "horizontal", and "lateral" are in reference to a major plane of a substrate in or on which the structures described are formed and are not necessarily defined by earth's gravitational field. A "horizontal" or "lateral" direction is a direction that is substantially parallel to the major plane of the substrate, while a "vertical" or "longitudinal" direction is a direction that is substantially perpendicular to the major plane of the substrate. The major plane of the substrate is defined by a surface of the substrate having a relatively large area compared to other surfaces of the substrate, such as by a substantially planar circular surface of a conventional semiconductor wafer substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1 through 5 are simplified partial cross-sectional views illustrating embodiments of a method of forming a semiconductor device structure including a stair step structure, such as a semiconductor device structure for a vertical memory device (e.g., a 3D NAND Flash memory device). With the description provided below, it will be readily apparent to one of ordinary skill in the art that the methods described herein may be used to form various other devices. In other words, the methods of the disclosure may be used whenever it is desired to form a stair step structure.

Figure 1:
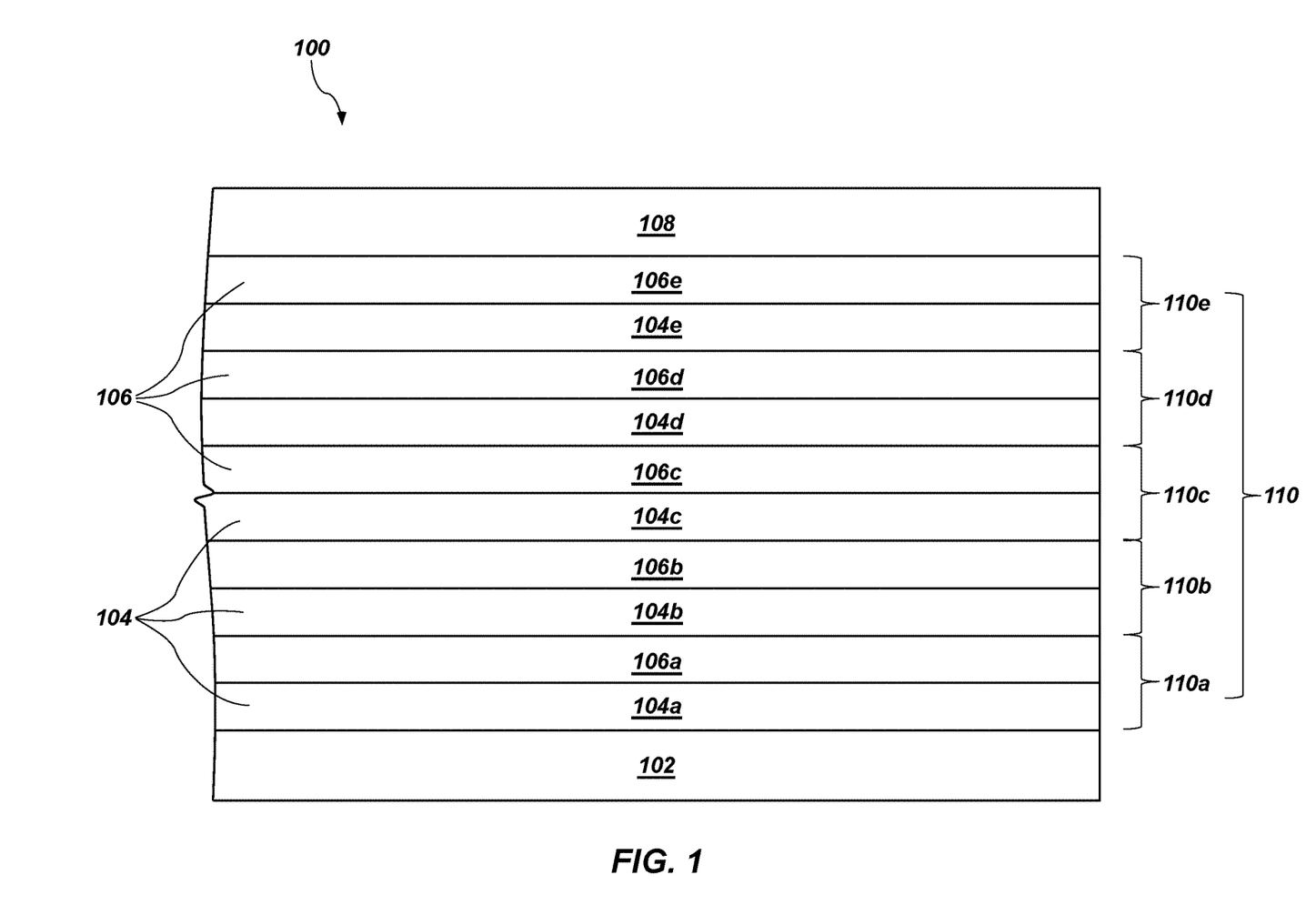
FIGS. 1 through 5 are cross-sectional views illustrating different process stages and structures for a method of forming a semiconductor device structure including a stair step structure, in accordance with an embodiment of the disclosure.

Referring to FIG. 1, a semiconductor device structure 100 may include a substrate 102, alternating conductive structures 104 and insulating structures 106 arranged in tiers 110 over the substrate 102, and a photoresist 108 over the tiers 110 of the conductive structures 104 and the insulating structures 106. For clarity and ease of understanding of the drawings and related description, FIG. 1 shows five (5) tiers 110 of the conductive structures 104 and the insulating structures 106. A first tier 110a includes a first conductive structure 104a and a first insulating structure 106a over the first conductive structure 104a; a second tier 110b overlies the first tier 110a, and includes a second conductive structure 104b and a second insulating structure 106b over the second conductive structure 104b; a third tier 110c overlies the second tier 110b, and includes a third conductive structure 104c and a third insulating structure 106c over the third conductive structure 104c; a fourth tier 110d overlies the third tier 110c, and includes a fourth conductive structure 104d and a fourth insulating structure 106d over the fourth conductive structure 104d; and a fifth tier 110e overlies the fourth tier 110d, and includes a fifth conductive structure 104e and a fifth insulating structure 106e over the fifth conductive structure 104e. However, the semiconductor device structure 100 may include a different number of tiers 110. For example, in additional embodiments, the semiconductor device structure 100 may include greater than five (5) tiers 110 (e.g., greater than or equal to ten (10) tiers 110, greater than or equal to twenty-five (25) tiers 110, greater than or equal to fifty (50) tiers 110, greater than or equal to one hundred (100) tiers 110) of the conductive structures 104 and the insulating structures 106, or may include less than five (5) tiers 110 (e.g., less than or equal to three (3) tiers 110) of the conductive structures 104 and the insulating structures 106.

The conductive structures 104 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the conductive structures 104 may independently include a substantially homogeneous distribution or a substantially heterogeneous distribution of the at least one conductive material. As used herein, the term "homogeneous distribution" means amounts of a material do not vary throughout different portions (e.g., different lateral and longitudinal portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 exhibits a substantially homogeneous distribution of conductive material. In additional embodiments, at least one of the conductive structures 104 exhibits a substantially heterogeneous distribution of at least one conductive material. The conductive structure 104 may, for example, be formed of and include a stack of at least two different conductive materials. The conductive structures 104 may each be substantially planar, and may each independently exhibit any desired thickness.

Each of the conductive structures 104 may be substantially the same (e.g., exhibit substantially the same material composition, average grain size, material distribution, size, and shape) as one another, or at least one of the conductive structures 104 may be different (e.g., exhibit one or more of a different material composition, a different average grain size, a different material distribution, a different size, and a different shape) than at least one other of the conductive structures 104. As a non-limiting example, each of the first conductive structure 104a, the second conductive structure 104b, the third conductive structure 104c, the fourth conductive structure 104d, and the fifth conductive structure 104e may exhibit substantially the same material composition, material distribution, and thickness. As another non-limiting example, at least one of the first conductive structure 104a, the second conductive structure 104b, the third conductive structure 104c, the fourth conductive structure 104d, and the fifth conductive structure 104e may exhibit one or more of a different material composition, a different material distribution, and a different thickness than at least one other of the first conductive structure 104a, the second conductive structure 104b, the third conductive structure 104c, the fourth conductive structure 104d, and the fifth conductive structure 104e. In some embodiments, each of the conductive structures 104 is substantially the same as each other of the conductive structures 104.

The insulating structures 106 may be formed of and include at least one insulating material, such as an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amphorous carbon, or a combination thereof. Each of the insulating structures 106 may independently include a substantially homogeneous distribution or a substantially heterogeneous distribution of the at least one insulating material. In some embodiments, each of the insulating structures 106 exhibits a substantially homogeneous distribution of insulating material. In additional embodiments, at least one of the insulating structures 106 exhibits a substantially heterogeneous distribution of at least one conductive material. The conductive structure 104 may, for example, be formed of and include a stack (e.g., laminate) of at least two different insulating materials. The insulating structures 106 may each be substantially planar, and may each independently exhibit any desired thickness.

Each of the insulating structures 106 may be substantially the same (e.g., exhibit substantially the same material composition, material distribution, size, and shape) as one another, or at least one of the insulating structures 106 may be different (e.g., exhibit one or more of a different material composition, a different material distribution, a different size, and a different shape) than at least one other of the insulating structures 106. As a non-limiting example, each of the first insulating structure 106a, the second insulating structure 106b, the third insulating structure 106c, the fourth insulating structure 106d, and the fifth insulating structure 106e may exhibit substantially the same material composition, material distribution, and thickness. As another non-limiting example, at least one of the first insulating structure 106a, the second insulating structure 106b, the third insulating structure 106c, the fourth insulating structure 106d, and the fifth insulating structure 106e may exhibit one or more of a different material composition, a different material distribution, and a different thickness than at least one other of the first insulating structure 106a, the second insulating structure 106b, the third insulating structure 106c, the fourth insulating structure 106d, and the fifth insulating structure 106e. In some embodiments, each of the insulating structures 106 is substantially the same as each other of the insulating structures 106.

As shown in FIG. 1, in some embodiments, the conductive structures 104 and the insulating structures 106 are arranged in an alternating sequence, beginning with one of the conductive structures 104. In additional embodiments, the conductive structures 104 and the insulating structures 106 exhibit a different arrangement relative to one another. By way of non-limiting example, the conductive structures 104 and the insulating structures 106 may be arranged in an alternating sequence beginning with one of the insulating structures 106. Accordingly, each of the tiers 110 may include one of the conductive structures 104 on or over one of the insulating structures 106. A semiconductor device (e.g., a vertical memory device, such as a 3D NAND Flash memory device) employing a semiconductor device structure having such a configuration may have little or no difference in terms of functionality or operability as compared to a semiconductor device employing the arrangement of the conductive structures 104 and the insulating structures 106 shown in FIG. 1.

The photoresist 108 may serve as a mask to enable selective removal of (e.g., etch) portions of the tiers 110 of the conductive structures 104 and the insulating structures 106 and form a stair step structure, as described in further detail below. The photoresist 108 may be formed of and include a conventional photoresist material, such as a conventional positive tone photoresist material, or a conventional negative tone photoresist material. Suitable photoresist materials are known in the art, and are, therefore, not described in detail herein. The photoresist 108 may be compatible with 13.7 nm, 157 nm, 193 nm, 248 nm, or 365 nm wavelength systems; with 193 nm wavelength immersion systems; and/or with electron beam lithographic systems. The photoresist 108 may be substantially planar, and may exhibit any desired thickness.

The substrate 102, the conductive structures 104, the insulating structures 106, and the photoresist 108 may each independently be formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, and ionized PVD. Such processes are known in the art and, therefore, are not described in detail herein.

Figure 2:
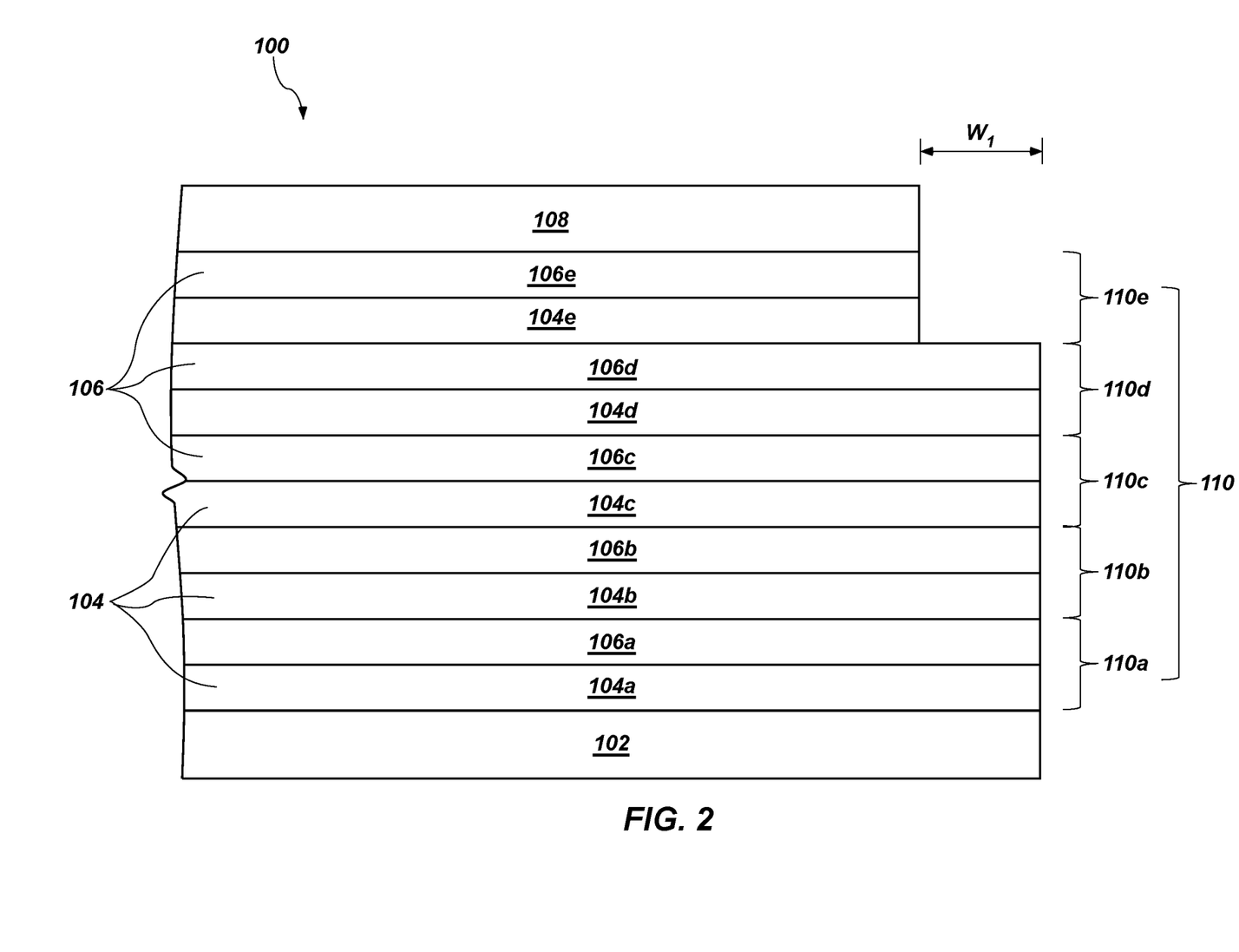

Referring next to FIG. 2, the semiconductor device structure 100 may be subjected to a first material removal process to remove (e.g., trim) a first width $W_1$ of the photoresist 108, and remove (e.g., etch) a portion of the fifth tier 110e (e.g., including a portion of each of the fifth insulating structure 106e and the fifth conductive structure 104e) to the first width $W_1$ using a remaining portion of the photoresist 108 as a mask. The first width $W_1$ may correspond to a width of a first step (e.g., a longitudinally lowest step, a step most longitudinally proximate the substrate 102) to be formed through subsequent processing (e.g., subsequent material removal processes), as described in further detail below. The first step may, for example, comprise portions of the first conductive structure 104a and the first insulating structure 106a not covered by at least one other of the tiers 110 of the conductive structures 104 and the insulating structures 106.

The magnitude of the first width $W_1$ of the photoresist 108 (and, hence, of the fifth insulating structure 106e and the fifth conductive structure 104e) removed by the first material removal process may be tailored to an overall width of the semiconductor device structure 100 and in consideration of an expected error distribution associated with all of the material removal processes (e.g., including the first material removal process and any subsequent material removal processes) used to form a stair step structure exhibiting a desired number of steps (e.g., corresponding to the number of conductive structures 104). The expected error distribution may be achieved using conventional modeling processes (e.g., mathematical modeling processes, such as stochastic modeling processes), which are not described in detail herein. Such modeling processes may, for example, evaluate various process parameters (e.g., material compositions, material distributions, material thicknesses, etch chemistries) in view of a desired stair step structure configuration (e.g., a desired overall stair step structure width, and a desired number of stair step structure steps). Error models (and, hence, the expected error distributions generated thereby) may be refined over time by correlation to multiple iterations of empirical data obtained through actual production and analysis. The first width $W_1$ may account for estimated (e.g., expected, projected) error associated with forming a first step of the stair step structure to be suitably sized (e.g., wide enough) and positioned to form a first contact structure thereon or thereover. For example, the first width $W_1$ may account for the likelihood and magnitude of potential over-removal and/or under-removal of the photoresist 108 (and, hence, underlying portions of the tiers 110 covered by the photoresist 108) during the formation of the first step. However, unlike additional widths of at least the photoresist 108 removed through subsequent material removal processes, the first width $W_1$ does not need to account for the estimated error associated with previous material removal processes. As described in further detail below, at least some additional widths of the photoresist 108 removed through subsequent material removal processes may be relatively larger than the first width $W_1$ to compensate (e.g., scale) for relatively larger amounts of estimated error (e.g., cumulative error associated with the subsequent material removal processes and any previous material removal processes). Such relatively larger additional widths may increase error margins (e.g., increase amounts of permissible error) associated with forming additional steps of the stair step structure to be suitably sized and positioned to form contact structures thereon or thereover.

The first material removal process may include photolithographically processing the photoresist 108 to remove the first width $W_1$ of the photoresist 108, and then removing a portion of the fifth tier 110e (e.g., including a portion of each of the fifth insulating structure 106e and the fifth conductive structure 104e) not covered by a remaining portion of the photoresist 108 using at least one etching process. For example, the photoresist 108 may be exposed to an appropriate wavelength (e.g., 13.7 nm, 157 nm, 193 nm, 248 nm, 365 nm) of radiation through a reticle and then developed to trim the first width $W_1$ of the photoresist 108 and expose a portion of the fifth insulating structure 106e, the exposed portion of the fifth insulating structure 106e may be selectively removed using an etching process (e.g., an anisotropic etching process, such as a dry etching process) to expose a portion of the fifth conductive structure 104e, and then the exposed portion of the fifth conductive structure 104e may be selectively removed using another etching process (e.g., another anisotropic etching process, such as another dry etching process) to expose a portion of the fourth insulating structure 106d. Process parameters (e.g., radiation wavelengths, developers, etchants, exposure times) of the first material removal process may be tailored to the configurations (e.g., material compositions, material distributions, thicknesses, arrangements) of the photoresist 108, the conductive structures 104, and the insulating structures 106.

Figure 3:
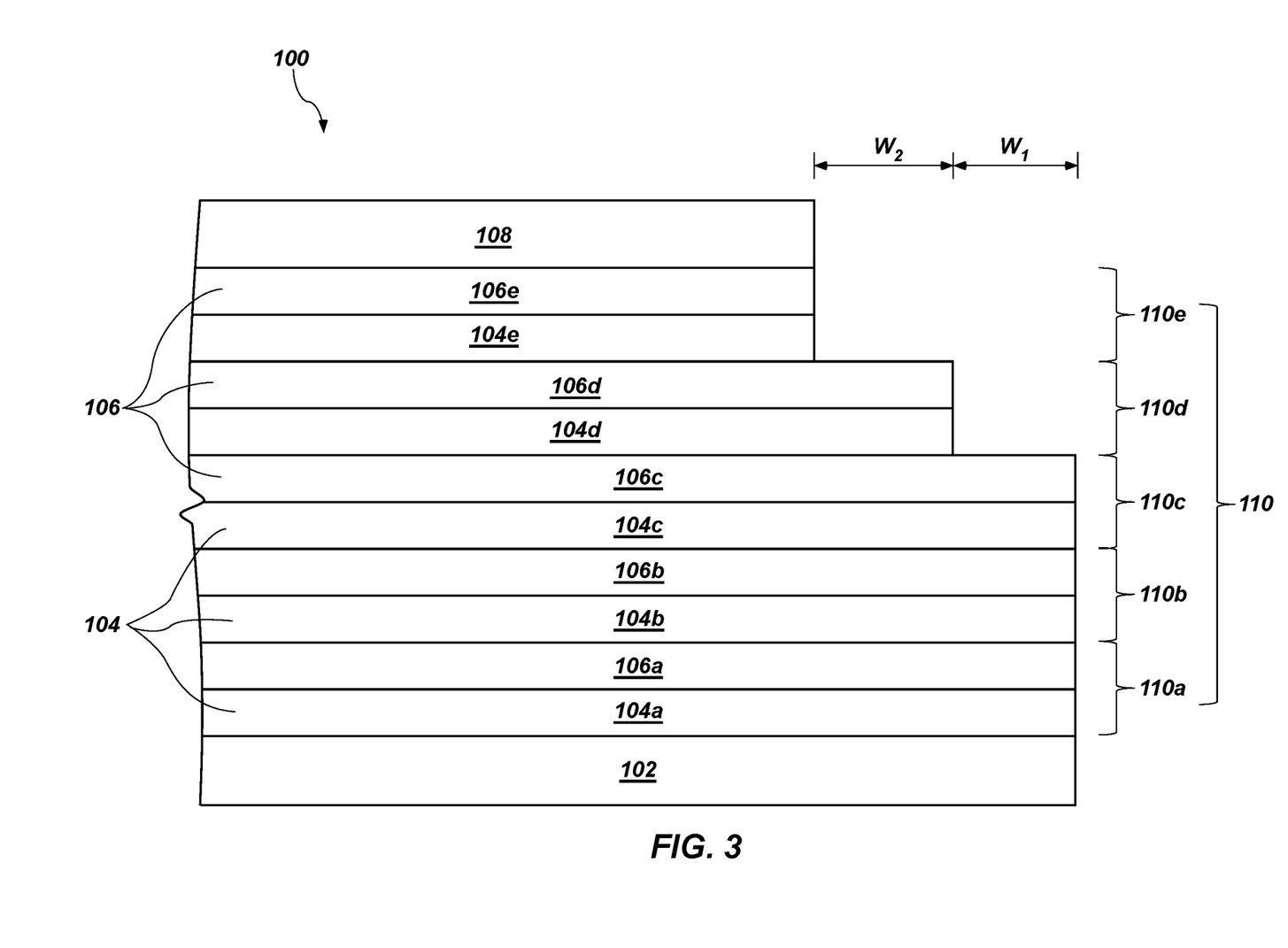

Referring next to FIG. 3, the semiconductor device structure 100 may be subjected to a second material removal process to remove (e.g., trim) a second width $W_2$ of the photoresist 108, to remove (e.g., etch) an additional portion of the fifth tier 110e (e.g., including another portion of each of the fifth insulating structure 106e and the fifth conductive structure 104e) to the second width $W_2$, and to remove a portion of the fourth tier 110d (e.g., including a portion of each of the fourth insulating structure 106d and the fourth conductive structure 104d) to the first width $W_1$. The additional portion of the fifth tier 110e and the portion of the fourth tier 110d may be substantially simultaneously removed using the second material removal process. The photoresist 108 remaining following the removal of the second width $W_2$ of the photoresist 108 may serve as a mask to remove the additional portion of the fifth tier 110e to the second width $W_2$, and the fifth tier 110e remaining following the first material removal process may serve a mask to remove the portion of the fourth tier 110d to the first width $W_1$. The second width $W_2$ may correspond to a width of a second step (e.g., a step longitudinally overlying and adjacent a first step) to be formed through subsequent processing (e.g., subsequent material removal processes), as described in further detail below. The second step may, for example, comprise portions of the second conductive structure 104b and the second insulating structure 106b not covered by at least one other of the tiers 110 of the conductive structures 104 and the insulating structures 106.

Similar to the first width $W_1$ described above, the magnitude of the second width $W_2$ of the photoresist 108 (and, hence, of the fifth insulating structure 106e and the fifth conductive structure 104e) removed by the second material removal process may be tailored to an overall width of the semiconductor device structure 100 and to the expected error distribution associated with all of the material removal processes (e.g., including the first material removal process, the second material removal process, and any subsequent material removal processes) used to form a stair step structure exhibiting a desired number of steps. The second width $W_2$ may account for estimated (e.g., expected, projected) cumulative error associated with forming a second step of the semiconductor device structure 100 to be suitably sized and positioned for a second contact structure to be formed thereon or thereover. The estimated cumulative error may factor in the estimated error associated with the second material removal process (e.g., the likelihood and magnitude of over-removal and/or under-removal of materials during the second material removal process), as well as potential shift in a desired position of the second step and/or the second contact structure due to variance in a desired position of the first step and/or the first contact structure resulting from estimated error associated with the first material removal process. If the estimated cumulative error associated with forming the second step is greater than the estimated error associated with forming the first step, the second width $W_2$ removed by the second material removal process may be greater than the first width $W_1$ removed by the first material removal process. Forming the second width $W_2$ to be larger than the first width $W_1$ may increase the error margin (e.g., increase the amount of permissible error) associated with forming the second step of the stair step structure to be suitably sized and positioned to form the second contact structure thereon or thereover. Conversely, if the estimated cumulative error associated with forming the second step is not much larger than (e.g., is substantially the same as) the estimated error associated with forming the first step, the second width $W_2$ removed by the second material removal process may be substantially the same as the first width $W_1$ removed by the first material removal process. In some embodiments, such as in embodiments wherein the estimated cumulative error for forming each additional step of the semiconductor device structure 100 gradually increases, the second width $W_2$ removed by the second material removal process is larger than the first width $W_1$ removed by the first material removal process. By way of non-limiting example, in some embodiments, a magnitude of the second width $W_2$ of the photoresist 108 removed by the second material removal processes is about 50 nm greater than a magnitude of the first width $W_1$ of the photoresist 108 removed through the first material removal process.

The second material removal process may include photolithographically processing the photoresist 108 to remove the second width $W_2$ of the photoresist 108 to, and then removing portions of the fifth tier 110e (e.g., including a portion of each of the fifth insulating structure 106e and the fifth conductive structure 104e) and the fourth tier 110d (e.g., including a portion of each of the fourth insulating structure 106d and the fourth conductive structure 104d) underlying the removed portion of the photoresist 108 using at least one etching process. For example, the photoresist 108 may be exposed to an appropriate wavelength (e.g., 13.7 nm, 157 nm, 193 nm, 248 nm, 365 nm) of radiation through a reticle and then developed to trim the second width $W_2$ from the photoresist 108 and expose an additional portion of the fifth insulating structure 106e, the additional exposed portion of the fifth insulating structure 106e and an exposed portion of the fourth insulating structure 106d may be selectively removed using an etching process (e.g., an anisotropic etching process, such as a dry etching process) to expose an additional portion of the fifth conductive structure 104e and a portion of the fourth conductive structure 104d, and then the additional exposed portion of the fifth conductive structure 104e and the exposed portion of the fourth conductive structure 104d may be selectively removed using another etching process (e.g., another anisotropic etching process, such as another dry etching process) to expose an additional portion of the fourth insulating structure 106d and a portion of the third insulating structure 106c. Process parameters (e.g., radiation wavelengths, developers, etchants, exposure times) of the second material removal process may be tailored to the configurations (e.g., material compositions, material distributions, thicknesses, arrangements) of the photoresist 108, the conductive structures 104, and the insulating structures 106. In some embodiments, at least one of a duration and an end-point scheme of the second material removal process is different than a duration and/or an end-point scheme of the first material removal process.

Figure 4:
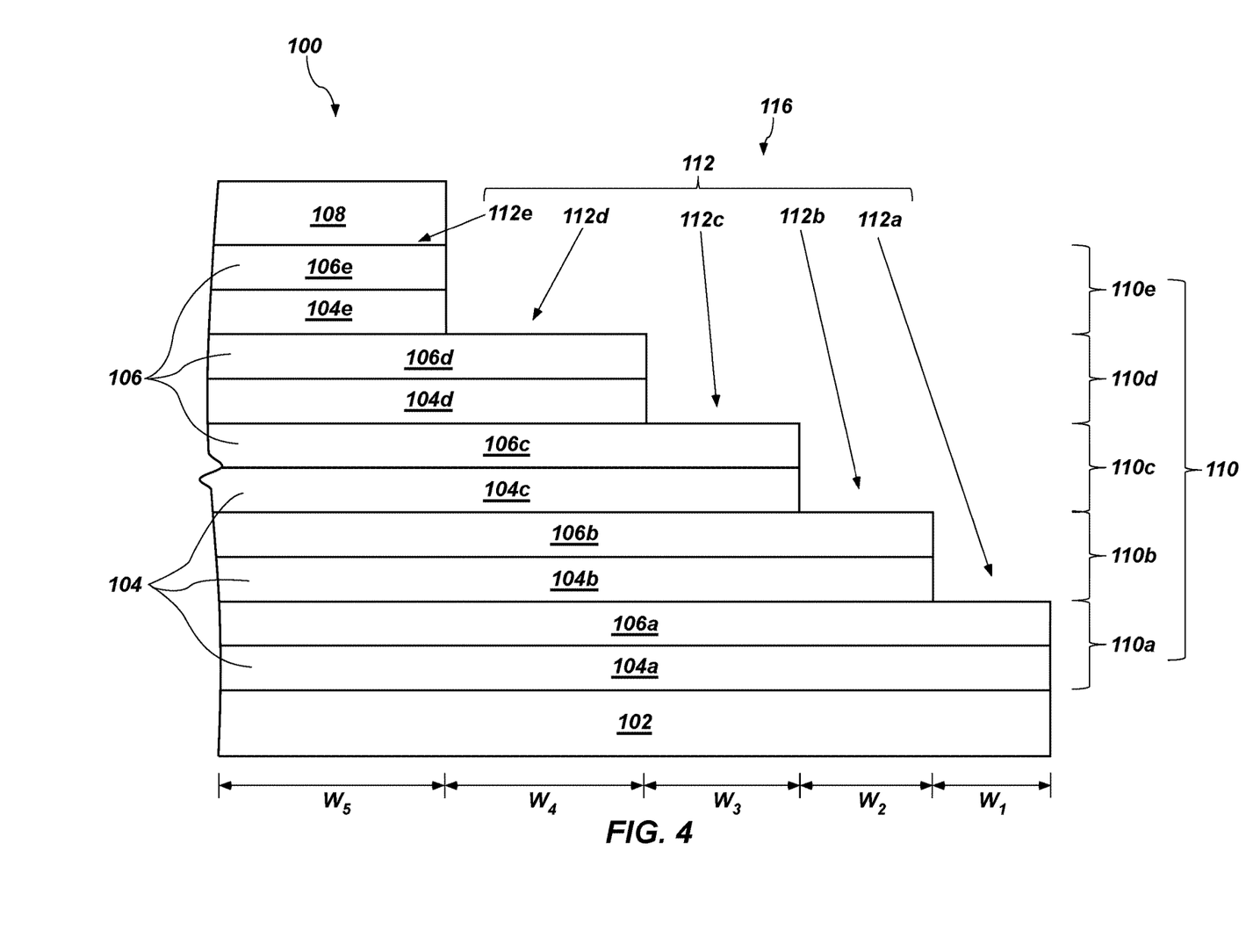

Referring next to FIG. 4, the semiconductor device structure 100 may be subjected to additional material removal processes to remove (e.g., trim) additional portions of the photoresist 108, the insulating structures 106, and the conductive structures 104 and form a stair step structure 116 including steps 112 at least partially defined by the resulting recessed edges of the tiers 110. For example, as shown in FIG. 4, the additional material removal processes may form a first step 112a at least partially defined by edges of the first tier 110a and by recessed edges of the second tier 110b overlying the first tier 110a, a second step 112b at least partially defined by the recessed edges of the second tier 110b and by recessed edges of the third tier 110c overlying the second tier 110b, a third step 112c at least partially defined by the recessed edges of the third tier 110c and by recessed edges of the fourth tier 110d overlying the third tier 110c, a fourth step 112d at least partially defined by the recessed edges of the fourth tier 110d and by recessed edges of the fifth tier 110e overlying the fourth tier 110d, and a fifth step 112e at least partially defined by the recessed edges of the fifth tier 110e. The additional material removal processes may trim additional widths from the photoresist 108 corresponding to widths of the steps 112. For example, a third material removal processes may remove a third width $W_3$ of the photoresist 108 corresponding to a width of the third step 112c, and a fourth material removal processes may remove a fourth width $W_4$ of the photoresist 108 corresponding to a width of the fourth step 112d. The width $W_5$ of the fifth step 112e of the stair step structure 116 may correspond to at least a portion of the fifth tier 110e remaining following the additional material removal processes.

While various embodiments herein are described and illustrated for clarity in the context of the stair step structure 116 as being formed to include five (5) steps 112, the stair step structure 116 may, alternatively, be formed to include a different number of steps 112. In some embodiments, the number of steps 112 formed directly corresponds to (e.g., is the same as) the number of conductive structures 104 included in the semiconductor device structure 100. By way of non-limiting example, if the semiconductor device structure 100 is formed to include fifty (50) of the conductive structures 104, the stair step structure 116 may be formed to include fifty (50) steps 112. In additional embodiments, the number of steps 112 formed may be different than (e.g., less than, or greater than) the number of conductive structures 104 included in the semiconductor device structure 100. By way of non-limiting example, if the semiconductor device structure 100 is formed to include fifty (50) conductive structures 104, the stair step structure 116 may be formed to include less than fifty (50) steps 112 (e.g., forty-nine (49) steps 112), or may be formed to include greater than fifty (50) steps 112 (e.g., fifty-one (51) steps 112).

The magnitude of each additional width (e.g., the third width $W_3$, the fourth width $W_4$) of the photoresist 108 removed by each additional material removal process, and the width (e.g., the fifth width $W_5$) of the photoresist 108 remaining after the additional material removal processes may be tailored to the overall width of the semiconductor device structure 100 and to the expected error distribution associated with all of the material removal processes used to form the stair step structure 116 of the semiconductor device structure 100. In some embodiments, a magnitude of at least one of the additional widths of the photoresist 108 removed by at least one of the additional material removal processes is about greater than or equal to about 20 nm (e.g., greater than or equal to about 30 nm, greater than or equal to about 40 nm, greater than or equal to about 50 nm) greater than the magnitude of a width of the photoresist 108 removed through an immediately preceding material removal process (e.g., the second material removal process, at least one other of the additional material removal processes). Similar to the second width $W_2$ described above, each width (e.g., the third width $W_3$, the fourth width $W_4$, and the fifth width $W_5$) may account for estimated (e.g., expected, projected) cumulative error associated with forming a corresponding step (e.g., the third step, the fourth step, and the fifth step) of the semiconductor device structure 100 to be sufficiently sized and positioned for a contact structure to be formed thereon or thereover. The estimated cumulative error associated with each additional material removal process may factor in the estimated error associated with the additional material removal process (e.g., the likelihood and magnitude of over-removal and/or under-removal of materials during the additional material removal process), as well as potential shift in a desired position of an associated step and/or an associated contact structure due to variance in a desired position of a preceding, longitudinal adjacent (e.g., a longitudinally lower and adjacent) step and/or an adjacent contact structure associated with the preceding, longitudinal adjacent step resulting from the estimated cumulative error associated with a previous material removal process.

As a non-limiting example, if the expected error distribution exhibits a gradual increase in estimated cumulative error, the additional widths (e.g., the third width $W_3$, the fourth width $W_4$) of the photoresist 108 removed by each additional material removal process may be tailored to gradually increase to compensate for the gradual increase in estimated cumulative error across the expected error distribution. For example, as shown in FIG. 4, the fifth width $W_5$ (e.g., the width of the fifth step) may be larger than the fourth width $W_4$ (e.g., the width of the fourth step), which may be larger than the third width $W_3$ (e.g., the width of the third step), which may be larger than the second width $W_2$ (e.g., the width of the second step), which may be larger than the first width $W_1$ (e.g., the width of the first step). The gradual increase in the widths (e.g., removed widths and a final remaining width) may gradually increase error margins (e.g., gradually increase amounts of permissible error, such as maximum amounts of permissible cumulative error) associated with forming progressively higher steps (e.g., steps more longitudinally distal from the substrate 102) of the stair step structure 116 to be sufficiently sized and positioned to form contact structures thereon or thereover.

In additional embodiments, depending on the expected error distribution, the widths of one or more of the steps 112 of the stair step structure 116 may be formed to vary in a different manner than that depicted in FIG. 4. For example, if the expected error distribution indicates that the estimated cumulative error associated with forming a higher step does not vary (e.g., increase) substantially from the estimated error (e.g., the estimated cumulative error) associated with forming a longitudinally adjacent lower step, the higher step may be formed to exhibit substantially the same width as the longitudinally adjacent lower step (e.g., the width of the longitudinally adjacent steps may not be varied). As another example, if the expected error distribution indicates that the estimated error (e.g., the estimated cumulative error) associated with forming a lower step (e.g., a step more longitudinally proximate from the substrate 102) is greater than the estimated error (e.g., estimated cumulative error) associated with forming a longitudinally adjacent higher step, the lower step may be formed to exhibit a larger width than the longitudinally adjacent higher step. As a further example, a first, lowest step of a stair step structure may exhibit a relatively greater width than a second, higher step of the stair step structure, and then the widths of higher steps (e.g., steps successively higher than the second step) of the stair step structure may vary (e.g., increase) in accordance with variances (e.g., increases) in estimated cumulative error across the expected error distribution.

The additional material removal processes may each include photolithographically processing the photoresist 108 to remove an additional width (e.g., the third width $W_3$, the fourth width $W_4$) of the photoresist 108, and then removing portions of the tiers 110 (e.g., portions of fifth tier 110e, the fourth tier 110d, the third tier 110c, and the second tier 110b) not covered by a remaining portion of the photoresist 108 using at least one etching process. Process parameters (e.g., radiation wavelengths, developers, etchants, exposure times) of the additional material removal processes may be tailored to the configurations (e.g., material compositions, material distributions, thicknesses, arrangements) of the photoresist 108, the conductive structures 104, and the insulating structures 106. In some embodiments, at least one of a duration and an end-point scheme of the one or more of the additional material removal processes is different than a duration and/or an end-point scheme of one or more of the first material removal process, the second material removal process, and at least one other of the additional material removal processes.

Figure 5:
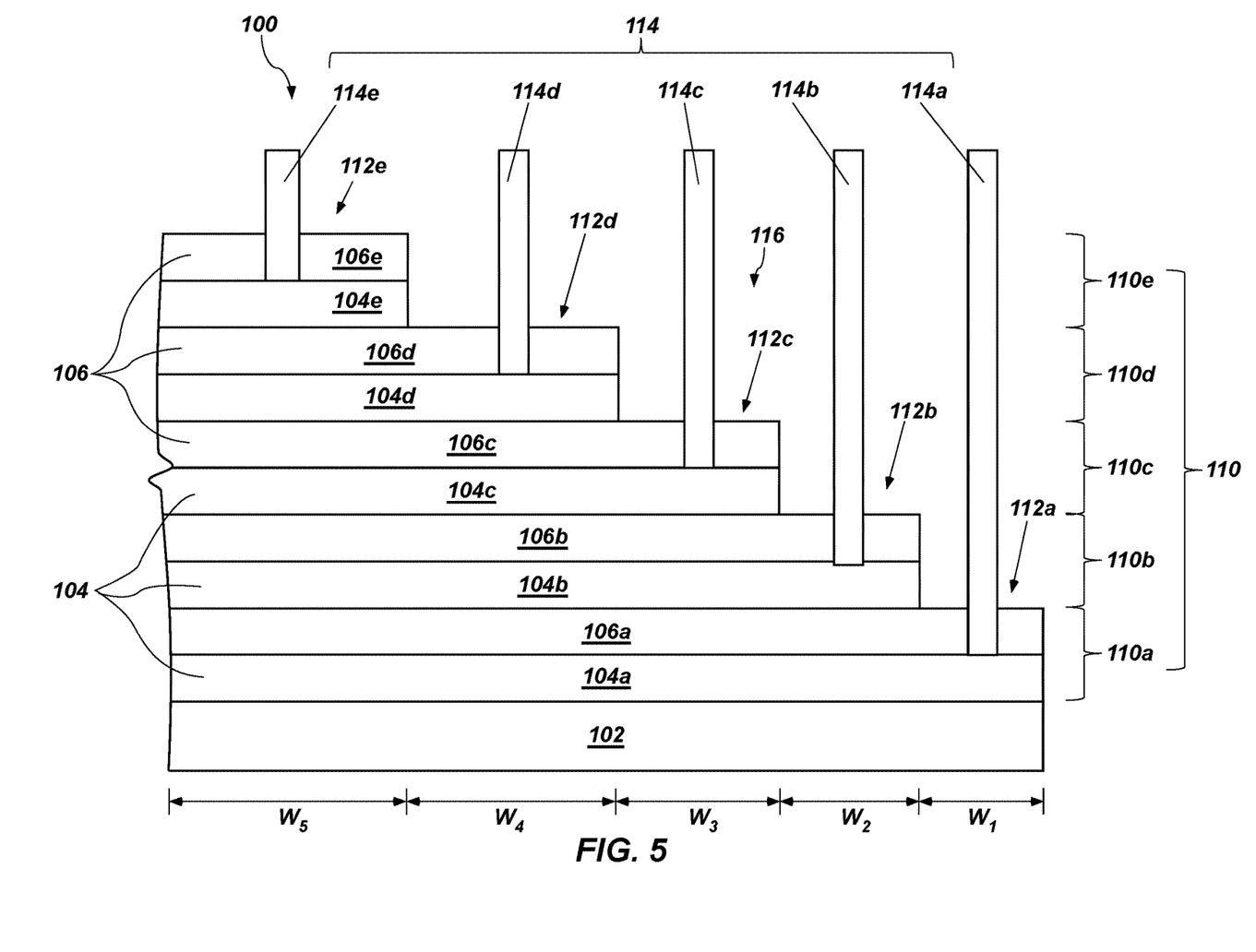

Referring next to FIG. 5, the remainder of the photoresist 108 (FIG. 4) may be removed, and contact structures 114 (e.g., conductive contacts) may be formed to provide electrical contact to each of the conductive structures 104 (e.g., the first conductive structure 104a of the first tier 110a, the second conductive structure 104b of the second tier 110b, the third conductive structure 104c of the third tier 110c, the fourth conductive structure 104d of the fourth tier 110d, and the fifth conductive structure 104e of the fifth tier 110e). The contact structures 114 may be formed on or over portions of the conductive structures 104 partially defining the steps 112 of the stair step structure 116. For example, as shown in FIG. 5, a first contact structure 114a may be formed on or over a portion of the first conductive structure 104a partially defining the first step 112a, a second contact structure 114b may be formed on or over a portion of the second conductive structure 104b partially defining the second step 112b, a third contact structure 114c may be formed on or over a portion of the third conductive structure 104c partially defining the third step 112c, a fourth contact structure 114d may be formed on or over a portion of the fourth conductive structure 104d partially defining the fourth step 112d, and a fifth contact structure 114e may be formed on or over a portion of the fifth conductive structure 104e partially defining the fifth step 112e. In additional embodiments, the contact structures 114 may be formed to exhibit a configuration different than that shown in FIG. 5. By way of non-limiting example, the contact structures 114 may be formed to longitudinally extend from each of the conductive structures 104, through the stair step structure 116, and to the substrate 102 (e.g., longitudinally toward the substrate 102 rather than or in addition to longitudinally away from the substrate 102). In other words, this disclosure is not limited to forming contact structures 114 longitudinally extending from the conductive structures 104 of the semiconductor device structure 100 in a direction longitudinally away from the substrate 102.

While various embodiments herein are described and illustrated for clarity in the context of the semiconductor device structure 100 as being formed to include five (5) contact structures 114, the semiconductor device structure 100 may, alternatively, be formed to include a different number of contact structures 114. The number of contact structures 114 formed may directly correspond to the number of conductive structures 104 (and, hence, the number of steps 112) included in the semiconductor device structure 100. By way of non-limiting example, if the semiconductor device structure 100 is formed to include fifty (50) conductive structures 104 (and, hence, fifty (50) steps 112), the semiconductor device structure 100 may also be formed to include fifty (50) contact structures 114 in electrical contract with each of the fifty (50) conductive structures 104.

The contact structures 114 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the contact structures 114 have substantially the same material composition, or at least one of the contact structures 114 may have a different material composition than at least one other of the contact structures 114.

As illustrated in FIG. 5, the contact structures 114 may be non-uniformly (e.g., unevenly) spaced apart from one another. A magnitude of the distance between adjacent contact structures 114 may at least partially depend on the widths of the steps 112 over which the adjacent contact structures 114 are positioned. The contact structures 114 may be formed to be generally centrally positioned on or over each of the steps 112. Accordingly, distances between adjacent contact structures 114 may vary in accordance with variance in the widths of the adjacent steps 112 associated with the adjacent contact structures 114. As a non-limiting example, if the widths (e.g., the first width $W_1$ through the fifth width $W_5$) of the steps 112 gradually increase from the first step 112a to the fifth step 112e, the distances between the contact structures 114 may also gradually increase from the first contact structure 114a through the fifth contact structure 114e. As another non-limiting example, if the widths of a group of three steps 112 do not substantially vary relative to one another (e.g., each of the three steps 112 exhibit substantially the same width), the distances between adjacent contact structures 114 of a group of three contact structures 114 associated with the group of three steps 112 may also not substantially vary relative to one another (e.g., the distance between each of the adjacent contact structures 114 may be substantially the same). As an additional non-limiting example, if the width of a middle step of a group of three steps 112 is greater than the width of each of a lower step and a higher step of the group of three steps 112 and the width of the higher step is also greater than the width of the lower step, the distance between adjacent contact structures 114 associated with the lower step and the middle step may be less than the distance between other adjacent contact structures 114 associated with the middle step and the higher step.

The variability in widths of the steps 112 and the non-uniform spacing of the contact structures 114 may increase error margins and landing margins for successfully contacting (e.g., electrically contacting) substantially all of the contact structures 114 with all of the conductive structures 104 of the tiers 110. The variability in widths of the steps 112 and the non-uniform spacing of the contact structures 114 may ensure that, even if processing errors (e.g., material removal errors, such as over-removal of materials and/or under-removal of materials; positioning errors) may occur during the formation of the semiconductor device structure 100 including the stair step structure 116 and the contact structures 114, substantially all of the contact structures 114 may nonetheless be provided in suitable contact (e.g., suitable electrical contact) with the conductive structures 104 of the tiers 110.

The contact structures 114 may be formed through conventional processes (e.g., conventional material deposition processes, conventional material removal processes), which are not described in detail herein. By way of non-limiting example, an insulating material (e.g., a silicon oxide, silicon nitride, borophosphosilicate glass, a spin-on dielectric) may be formed on or over at least the stair step structure 116 of the semiconductor device structure 100, openings (e.g., vias, apertures) may be formed through the insulating material and portions of the insulating structures 106 defining the steps 112 of the tiers 110 to expose contact regions of the underlying conductive structures 104, and the openings may be filled with a conductive material to form the contact structures 114.

Thus, in accordance with embodiments of the disclosure, a method of forming a semiconductor device structure comprises forming tiers comprising conductive structures and insulating structures in a stacked arrangement over a substrate. Portions of the tiers are selectively removed to form a stair step structure comprising a selected number of steps, the steps exhibiting different widths substantially corresponding to variances in projected error associated with forming the steps. Contact structures are formed on the steps of the stair step structure.

In addition, in accordance with embodiments of the disclosure, a semiconductor device structure comprises a stair step structure comprising steps of varying (e.g., different) width at least partially defined by laterally peripheral portions of partially conductive tiers overlying a substrate, and non-uniformly spaced contact structures over and in contact with the steps.

Figure 6:
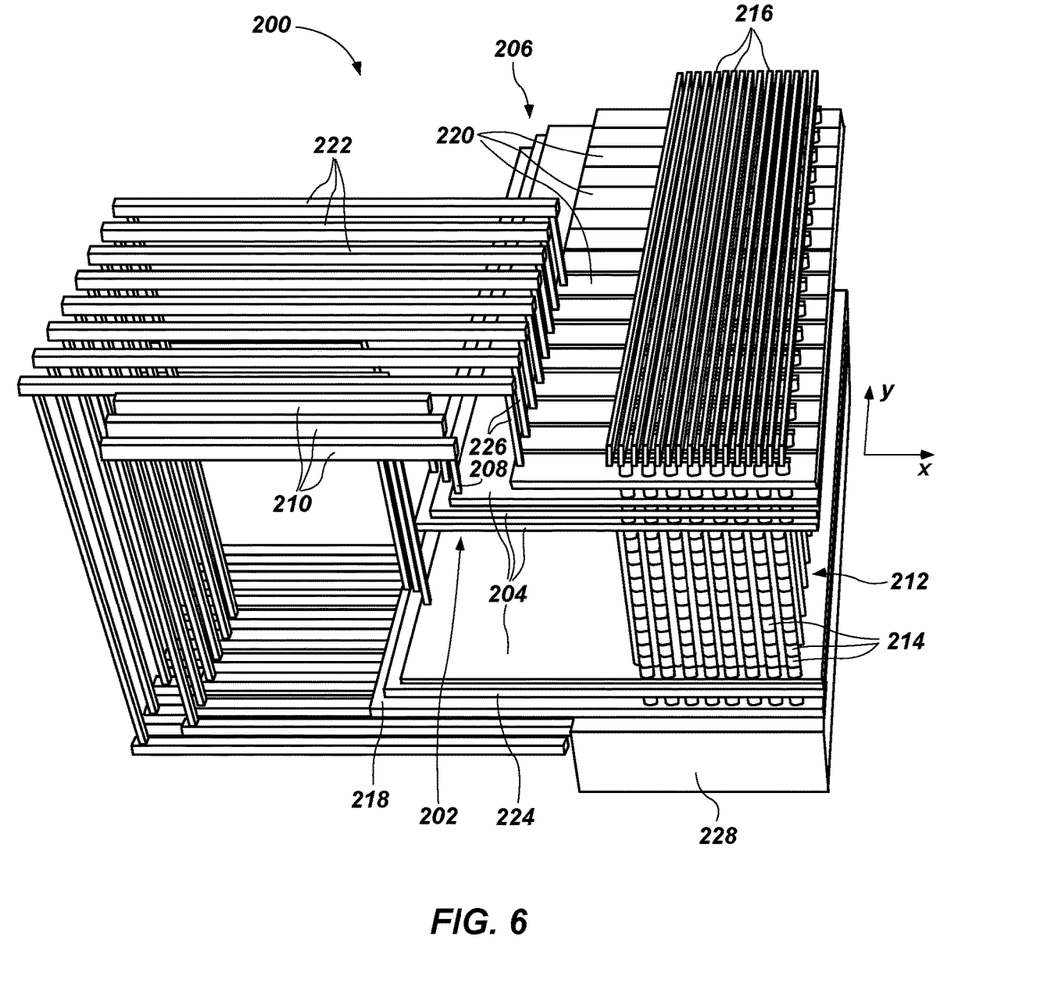
FIG. 6 is a partial cutaway perspective view of a vertical memory device including a semiconductor device structure having a stair step structure, in accordance with an embodiment of the disclosure.

FIG. 6 illustrates a partial cutaway perspective view of a portion of a semiconductor device 200 (e.g., a vertical memory device, such as a 3D NAND Flash memory device) including a semiconductor device structure 202 including tiers 204 of conductive structures and insulative structures defining a stair step structure 206, and contact structures 208 electrically connected to steps of the stair step structure 206. The semiconductor device structure 202 (e.g., including the tiers 204 of conductive structures and insulative structures, the stair step structure 206, and the contact structures 208) may be substantially similar to and may be formed in substantially the same manner as the semiconductor device structure 100 (e.g., including the tiers 110 of the conductive structures 104 and the insulating structures 106, the stair step structure 116, and the contact structures 114) previously described in with respect to FIGS. 1-5. The semiconductor device 200 may further include vertical strings 212 of memory cells 214 coupled to each other in series, data lines 216 (e.g., bit lines), a source tier 218, access lines 210, first select gates 220 (e.g., upper select gates, drain select gates (SGDs)), select lines 222, a second select gate 224 (e.g., a lower select gate, a source select gate (SGS)), and additional contact structures 226. The vertical strings 212 of memory cells 214 extend vertically and orthogonal to conductive lines and tiers (e.g., the data lines 216, the source tier 218, the tiers 204 of the semiconductor device structure 202, the access lines 210, the first select gates 220, the select lines 222, the second select gate 224), and the contact structures 208 and the additional contact structures 226 may electrically couple components to each other as shown (e.g., the select lines 222 to the first select gates 220, the access lines 210 to the tiers 204 of the semiconductor device structure 202). The semiconductor device 200 may also include a control unit 228, which may include one or more of string driver circuitry, pass gates, circuitry for selecting gates, circuitry for selecting conductive lines (e.g., the data lines 216, the access lines 210), circuitry for amplifying signals, and circuitry for sensing signals. The control unit 228 may, for example, be electrically coupled to the data lines 216, source tier 218, access lines 210, first select gates 220, and second select gate 224, for example.

Thus, in accordance with embodiments of the disclosure, a semiconductor device comprises alternating conductive structures and insulating structures arranged in stacked tiers overlying a substrate, a stair step structure comprising steps of varying widths comprising lateral end portions of the stacked tiers, and contact structures in physical contact with the steps. Each of the stacked tiers comprises one of the conductive structures and one of the insulating structures.

The methods and structures of the disclosure may substantially alleviate error-propagation-based problems related to the formation and processing of semiconductive device structures including stair step structures. For example, tailoring the widths of the steps 112 and the spacing of the contact structures 114 of the semiconductor device structure 100 to an expected error distribution may increase error margins where they most needed (e.g., for steps 112 of the stair step structure 116 more likely to exhibit error-propagation-based deficiencies in suitable width and/or suitable position) without impacting the overall width of the stair step structure 116 and/or the semiconductor device structure 100. Selectively modifying the error margins based on predetermined design needs may, in turn, facilitate increased yield as compared to conventional methods of forming semiconductor device structures including stair step structures. In addition, the methods and structures of the disclosure may not require additional processing acts (e.g., additional photolithography acts, additional etching acts) and/or additional processing materials (e.g., additional etchants) as compared to conventional methods of forming a semiconductor device structure including stair step structures, providing increased yield without a corresponding decrease in process efficiency and/or a significant increase in processing costs.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A semiconductor device structure, comprising:
   a stair step structure comprising steps at least partially defined by laterally peripheral portions of partially conductive tiers overlying a substrate, the steps comprising:
      a lower step;
      an upper step; and
      a middle step longitudinally between the lower step and the upper step, the middle step having a greater width than a width of the lower step and a width of the upper step; and
   non-uniformly spaced contact structures over and in contact with the steps.

2. The semiconductor device structure of claim 1, wherein the steps further comprises a lowermost step located most longitudinally proximate the substrate and having a width greater than the lower step.

3. A semiconductor device, comprising:
   alternating conductive structures and insulating structures arranged in stacked tiers overlying a substrate, each of the stacked tiers comprising one of the conductive structures and one of the insulating structures;
   a stair step structure comprising steps comprising lateral end portions of the stacked tiers, the steps comprising:
      a first step;
      a second step longitudinally above the first step and having a larger width than the first step; and
      a third step longitudinally above the second step and having a smaller width than the second step; and
   contact structures in physical contact with the steps.

4. The semiconductor device of claim 3, wherein each of the steps exhibits a different width than each other of the steps.

5. The semiconductor device of claim 3, wherein at least some of the steps exhibit a first width and at least some other of the steps exhibit a second width larger than the first width.

6. The semiconductor device of claim 5, wherein the at least some steps are located more proximate the substrate than the at least some other of the steps.

7. The semiconductor device of claim 3, wherein the contact structures are non-evenly spaced apart from one another.

8. The semiconductor device of claim 3, wherein:
   the first step is directly laterally adjacent the second step; and
   the second step is directly laterally adjacent the third step.

9. The semiconductor device of claim 3, further comprising a fourth step having a larger width than the third step.

10. The semiconductor device of claim 9, wherein the fourth step is longitudinally farther from the substrate than the third step.

11. The semiconductor device of claim 3, further comprising at least one additional step having the same width as one of the first step, the second step, and the third step.

12. A semiconductor device, comprising:
    a conductive stack structure comprising tiers each comprising a conductive structure and an insulating structure longitudinally adjacent the conductive structure;
    a stair step structure having steps comprising lateral ends of the tiers of the conductive stack structure, at least four of the steps having different widths than one another, and the steps comprising:
       a step;
       another step; and
       at least one additional step longitudinally between the step and the another step, the at least one additional step having a greater width than each of the step and the another step; and
    conductive contact structures in physical contact with the steps of the stair step structure.

13. The semiconductor device of claim 12, wherein each of the steps of the stair step structure has a different width than each other of the steps of the stair step structure.

14. The semiconductor device of claim 12, wherein at least one of the steps of the stair step structure has the same width as at least one other of the steps of the stair step structure.

15. The semiconductor device of claim 12, wherein each of the conductive contact structures is centrally laterally positioned on a step of the stair step structure.

* * * * *

UNITED STATES PATENT AND TRADEMARK OFFICE
CERTIFICATE OF CORRECTION

PATENT NO. : 10,672,657 B2
APPLICATION NO. : 15/906366
DATED : June 2, 2020
INVENTOR(S) : Matthew Park, Adam L. Olson and Jixin Yu

Page 1 of 1

It is certified that error appears in the above-identified patent and that said Letters Patent is hereby corrected as shown below:

On the Title Page
In ITEM (62)   Line 2,   change "27, 2015." to --27, 2015, now Pat. No. 10,453,748.--

In the Specification
Column 1,   Line 10,   change "2015, pending, the" to
--2015, now U.S. Patent No. 10,453,748, issued October 22, 2019, the--

Signed and Sealed this
First Day of September, 2020

Andrei Iancu
*Director of the United States Patent and Trademark Office*